United States Patent
Harada et al.

(10) Patent No.: US 8,182,729 B2
(45) Date of Patent: May 22, 2012

(54) WIRING BOARD AND METHOD OF MAKING THE SAME

(75) Inventors: Toshikazu Harada, Kariya (JP); Koji Kondo, Toyohashi (JP); Atusi Sakaida, Nagoya (JP); Toshihisa Taniguchi, Handa (JP); Keiji Okamoto, Kariya (JP)

(73) Assignee: DENSO CORPORATION, Kariya (JP)

( * ) Notice: Subject to any disclaimer, the term of this patent is extended or adjusted under 35 U.S.C. 154(b) by 468 days.

(21) Appl. No.: 12/382,138

(22) Filed: Mar. 10, 2009

(65) Prior Publication Data

US 2009/0229869 A1    Sep. 17, 2009

(30) Foreign Application Priority Data

Mar. 12, 2008 (JP) .................................. 2008-62759
Dec. 17, 2008 (JP) ................................. 2008-321428

(51) Int. Cl.
B29C 65/02    (2006.01)

(52) U.S. Cl. ........ 264/257; 264/241; 264/261; 264/319; 257/700

(58) Field of Classification Search .................. 264/241, 264/257, 261, 319
See application file for complete search history.

(56) References Cited

U.S. PATENT DOCUMENTS

| 2002/0076903 | A1 |   | 6/2002 | Kondo et al. |   |
|---|---|---|---|---|---|
| 2003/0209796 | A1 | * | 11/2003 | Kondo et al. | 257/690 |

FOREIGN PATENT DOCUMENTS

| JP | A-05-69442 |   | 3/1993 |
|---|---|---|---|
| JP | A-05-132568 |   | 5/1993 |
| JP | A-06-252555 |   | 9/1994 |
| JP | A-07-115280 |   | 5/1995 |
| JP | A-07-156172 |   | 6/1995 |
| JP | A-07-323501 |   | 12/1995 |
| JP | A-2001-196747 |   | 7/2001 |
| JP | 2002-111215 | * | 4/2002 |
| JP | A-2002-111215 |   | 4/2002 |
| JP | A-2002-249605 |   | 9/2002 |
| JP | A-2002-299814 |   | 10/2002 |

OTHER PUBLICATIONS

Japanese Office Action mailed on Dec. 1, 2009 issued from the Japanese Patent Office in the corresponding Japanese patent application No. 2008-321428 (with English translation).

* cited by examiner

*Primary Examiner* — Christina Johnson
*Assistant Examiner* — Saeed Huda
(74) *Attorney, Agent, or Firm* — Posz Law Group, PLC

(57) ABSTRACT

In a method of making a multilayer wiring board having a substrate and a wiring pattern formed in the substrate, base films are stacked in a predetermined direction to form a stacked film structure. Each base film includes thermoplastic resin. Pressure and heat are applied to the stacked film structure from its both sides in the stacked direction so that the base films are joined together to form the substrate. At least one of the base films is a combined film including a fiber sheet. Both sides of the fiber sheet are covered with the thermoplastic resin in such a manner that air space remains in the fiber sheet.

8 Claims, 4 Drawing Sheets

WIRING BOARD AND METHOD OF MAKING THE SAME

CROSS REFERENCE TO RELATED APPLICATION

This application is based on and incorporates herein by reference Japanese Patent Applications No. 2008-62759 filed on Mar. 12, 2008 and No. 2008-321428 filed on Dec. 17, 2008.

FIELD OF THE INVENTION

The present invention relates to a wiring board having an electrically insulating substrate and a wiring pattern disposed in the substrate, and also relates to a method of making the wiring board.

BACKGROUND OF THE INVENTION

U.S. patent publication number 2002/0076903 and 2003/0209796 corresponding to Japanese patent publication number 2003-86948 disclose a method of making a wiring board having an electrically insulating substrate and a wiring pattern disposed in the substrate. In the method, multiple resin films made of thermoplastic resin are stacked and collectively joined together by application of pressure and heat, thereby forming the substrate.

In recent years, there has been an increasing need to reduce manufacturing time of a wiring board in order to reduce manufacturing cost of the wiring board. In the above method, since it takes several hours (e.g., 2 to 5 hours) to complete the pressure and heat application process, manufacturing cost of the wiring board can be reduced by reducing the time taken to complete the pressure and heat application process.

For example, the time taken to complete the pressure and heat application process can be reduced by increasing a gradient of change in temperature (i.e., a rate of change in temperature per unit time) in the pressure and heat application process. However, the present inventors have found that hydrolysis of thermoplastic resin included in the resin film occurs when the temperature change rate in the pressure and heat application process is increased. The hydrolysis of thermoplastic resin can degrade characteristics of the substrate such as heat resistance and mechanical strength.

SUMMARY OF THE INVENTION

In view of the above, it is an object of the present invention to provide a method of making a wiring board by reducing a manufacturing time and by preventing hydrolysis of thermoplastic resin that forms a substrate of the wiring board. It is another object of the present invention to provide a wiring board made by the method.

According to an aspect of the present invention, a method of making a wiring board includes stacking multiple base films in a predetermined direction to form a stacked film structure. Each base film includes thermoplastic resin. The method further includes applying pressure and heat to the stacked film structure from its both sides in the direction so that the base films are integrally joined together to form an electrically insulating substrate. At least one of the base films is a combined film including a fiber sheet having both sides in the direction. The both sides of the fiber sheet are covered with the thermoplastic resin in such a manner that air space remains in the fiber sheet.

According to another aspect of the present invention, a wiring board includes an electrically insulating substrate and a wiring pattern. The substrate includes a combined film having a fiber sheet and a thermoplastic resin portion. The resin portion is located on both sides of the fiber sheet in a thickness direction of the substrate. The wiring pattern is formed in the resin portion.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENT

Figure 1:
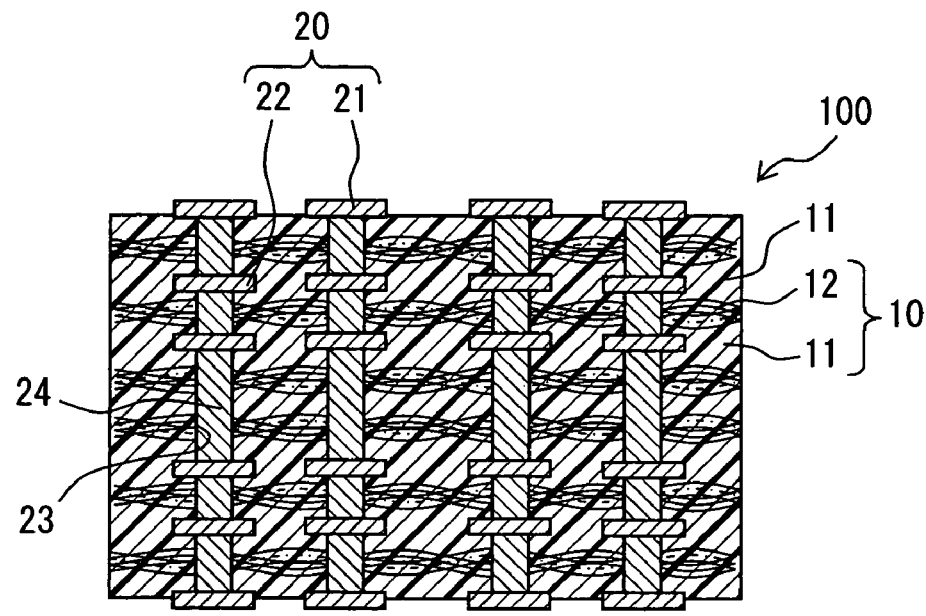
FIG. 1 is a diagram illustrating a cross-sectional view of a wiring board according to an embodiment of the present invention.

As to a conventional wiring board, the present inventors have actually observed that hydrolysis of thermoplastic resin included in a resin film occurs when a temperature change rate in a pressure and heat application process is increased. The present inventors have investigated the cause of the hydrolysis and have assumed the cause of the hydrolysis as follows.

A resin film contains moisture due to its hygroscopicity. Further, a conductive paste, which is sintered to an interlayer connecting member for electrically connecting wiring patterns, contains a solvent (i.e., moisture). The moisture contained in the resin film and the conductive paste cannot perfectly escape outside a substrate before the hydrolysis occurs. That is, the moisture partially remains in the substrate even at a temperature at which the hydrolysis occurs. The remaining moisture causes the hydrolysis.

Based on the above investigation, a wiring board 100 according to an embodiment of the present invention is described below with reference to FIG. 1. The wiring board 100 is formed as a multilayer board. The wiring board 100 mainly includes an electrically insulating substrate 10 and a wiring pattern 20 formed in the substrate 10 in a multilayer manner.

The substrate 10 is substantially rectangular in plan. The substrate 10 includes a resin portion 11 and a fiber sheet portion 12.

The resin portion 11 has the same plan shape as the substrate 10. The resin portion 11 is made of a material including thermoplastic resin. For example, the material for the resin portion 11 can be made by mixing liquid crystal polymer (LCP), polyether ketone (PEEK), and polyetherimide (PEI) in a predetermined mixture ratio. In the embodiment, the resin portion 11 is made of a mixture of PEEK and PEI. The resin portion 11 and the fiber sheet portion 12 are integrally joined together.

The fiber sheet portion 12 is made by arranging fibers in a sheet manner. The fiber sheet portion 12 has the same plan shape as the substrate 10. That is, an edge of the fiber sheet portion 12 extends to an edge of the substrate 10 in a planer direction of the substrate 10. The planer direction of the substrate 10 is perpendicular to a thickness direction of the substrate 10. The thickness direction of the substrate 10 is a direction in which the wiring pattern 20 is formed in a multilayer manner. The fiber sheet portion 12 can be a nonwoven cloth or a woven cloth. For example, the fiber sheet portion 12 can be made of glass fiber, aramid fiber, or the like. The thermoplastic resin of the resin portion 11 at least partially enters between fibers of the fiber sheet portion 12 from both sides of the fiber sheet portion 12 in a thickness direction of the fiber sheet portion 12. Thus, both sides of the fiber sheet portion 12 are covered with the thermoplastic resin of the resin portion 11 so that the resin portion 11 and the fiber sheet portion 12 can be integrally joined together.

In the embodiment, the fiber sheet portion 12 is a glass cloth that is a woven cloth made of glass fiber. As shown in FIG. 1, six fiber sheet portions 12 are stacked and spaced from each other in the thickness direction of the substrate 10. The resin portion 11 is placed on each side of each fiber sheet portion 12 in the thickness direction of the substrate 10. That is, each fiber sheet portion 12 is sandwiched between adjacent resin portions 11 such that both sides of the substrate 10 in the thickness direction of the substrate 10 are provided with the resin portion 11. In the wiring board 100, the thermoplastic resin of the resin portion 11 enters between the fibers of the fiber sheet portion 12 so that air space in the fiber sheet portion 12 can be entirely filled with the thermoplastic resin. In this way, the fiber sheet portion 12 is buried in the resin portion 11.

The wiring pattern 20 is made of an electrically conductive material such as copper. The wiring pattern 20 is formed in the substrate 10 in a multilayer manner and in contact with the resin portion 11. In the embodiment, the wiring pattern 20 is formed by patterning copper foil. The wiring pattern 20 includes two outer wiring patterns 21 and four inner wiring patterns 22. The outer wiring patterns 21 are exposed at both sides of the substrate 10, respectively. The inner wiring patterns 22 are located inside the substrate 10. In this way, the wiring pattern 20 has six layers and is integrally joined to the substrate 10. The outer wiring patterns 21 and the inner wiring patterns 22 are coupled together through a via hole 23 formed in the substrate 10. An interlayer connecting member 24 having an electrical conductivity is placed in the via hole 23. Thus, the outer wiring patterns 21 and the inner wiring patterns 22 are electrically coupled together by the interlayer connecting member 24.

A method of making the wiring board 100 shown in FIG. 1 is described below with reference to FIGS. 2A-4B.

Figure 2A:
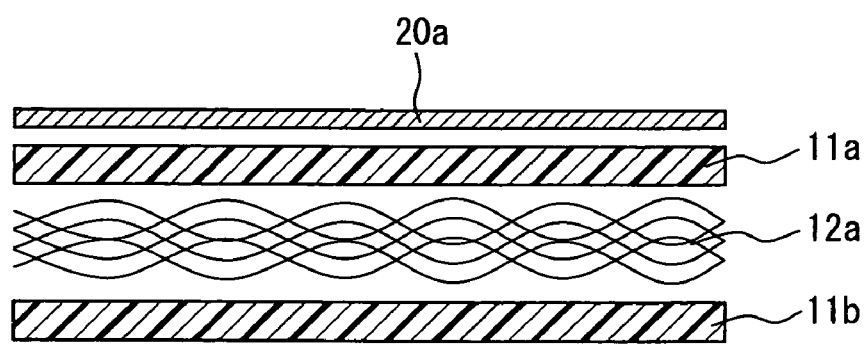
FIG. 2A is a diagram illustrating a cross-sectional view of a combined film, used in a substrate of the wiring board, before first pressure and first heat are applied.

Firstly, in a process shown in FIG. 2A, first and second resin films 11a, 11b made of thermoplastic resin, a fiber sheet 12a, and a conductive foil 20a are prepared. In the embodiment, each of the first and second resin films 11a, 11b has a thickness of about 50 micrometers (μm) and is made of about 65 to 15 weight percent of PEEK and about 35 to 85 weight percent of PEI. The fiber sheet 12a is a glass cloth having a thickness of about 50 μm. The conductive foil 20a is a copper foil. Then, the fiber sheet 12a is placed on the second resin film 11b, the first resin film 11a is placed on the fiber sheet 12a, and the conductive foil 20a is placed on the first resin film 11a. Thus, the second resin film 11b, the fiber sheet 12a, the first resin film 11a, and the conductive foil 20a are stacked in the mentioned order to from a combined film structure. In the combined film structure, thermoplastic resin of each of the first and second resin films 11a, 11b does not yet enter between fibers of the fiber sheet 12a so that there is an air space 13 in the whole fiber sheet 12a.

Figure 2B:
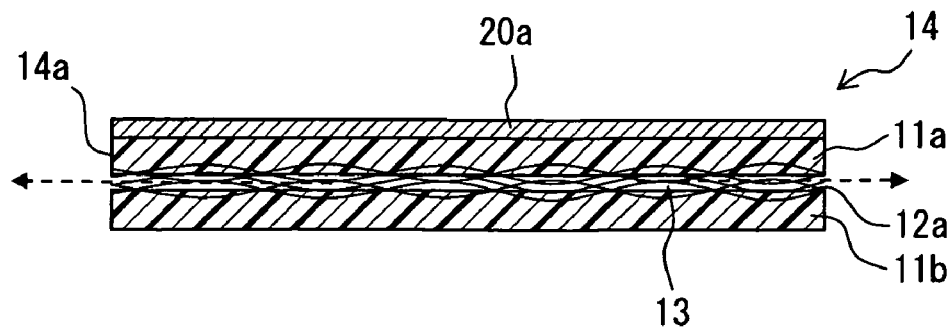
FIG. 2B is a diagram illustrating a cross-sectional view of the combined film after the first pressure and heat are applied.

Next, in a process shown in FIG. 2B, a first pressure and a first heat are applied to the combined film structure from its both sides by using a vacuum hot-pressing machine. As a result, the first and second resin films 11a, 11b become soft so that the thermoplastic resin of the first and second resin films 11a, 11b can enter the air space 13 in the fiber sheet 12a. Thus, the first and second resin films 11a, 11b and the fiber sheet 12a are integrally joined together to form a combined film 14 (as a base film). It is noted that, in the combined film 14, the air space 13 in the fiber sheet 12a is not entirely filled with the thermoplastic resin of the resin films 11a, 11b. In the embodiment, the air space 13 extends from one end of the combined film 14 to the other end of the combined film 14 in a planar direction of the combined film 14 and is open to outside of the combined film 14 at both ends. Therefore, the air space 13 has a shape like a layer, and the first and second resin films 11a, 11b are spaced from each other by the air space 13.

The conductive foil 20a is bonded on a front side of the combined film 14 by the application of the first pressure and heat. Specifically, the conductive foil 20a is bonded on the softened first resin film 11a in the first pressure and heat application process. Thus, the conductive foil 20a and the combined film 14 are integrally joined together.

Figure 3A:
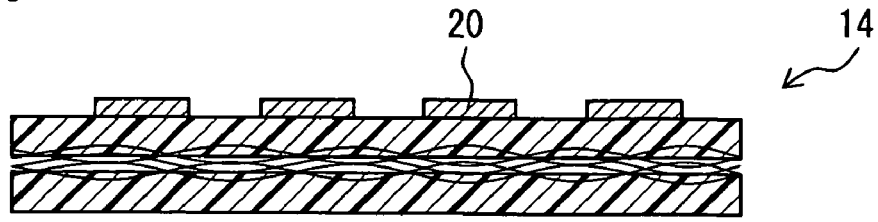
FIGS. 3A-3D are diagrams illustrating a method of processing the combined film.

Next, in a process shown in FIG. 3A, the conductive foil 20a on the front side of the combined film 14 is patterned by photolithography and etching to form the wiring pattern 20. After the wiring pattern 20 is formed, a protection film 30 is placed on a back side of the combined film 14. Another protection film 30 can be placed on the first side of the combined film 14 to cover the wiring pattern 20.

Figure 3B:
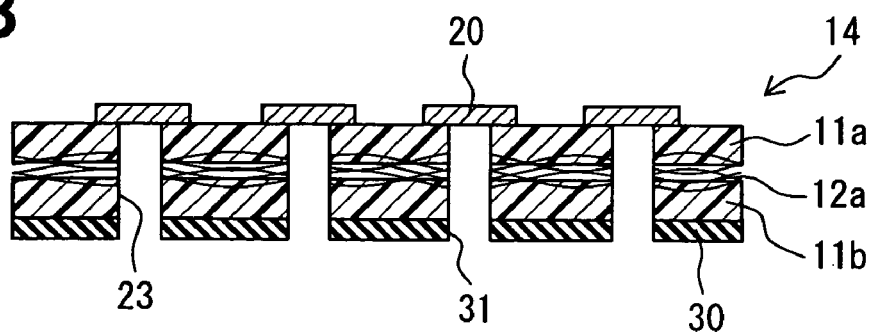

Then, in a process shown in FIG. 3B, a hole 31 is formed in the combined film 14 from the protection film 30 side, for example, by a laser. The hole 31 penetrates through the protection film 30, the second resin film 11b, the fiber sheet 12a, and the first resin film 11a. The hole 31 is exposed to the wiring pattern 20 and does not penetrate through the wiring pattern 20. That is, the wiring pattern 20 is a bottom of the hole 31, and the hole 31 serves as the via hole 23.

Figure 3C:
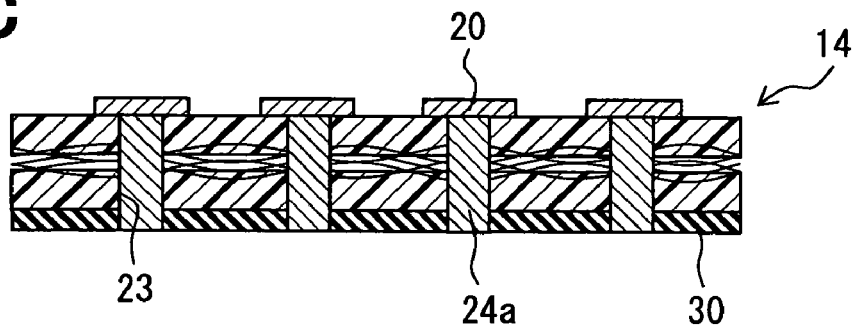

Then, in a process shown in FIG. 3C, the hole 31 is filled with an electrically conductive paste 24a, for example, by screen printing.

Figure 3D:
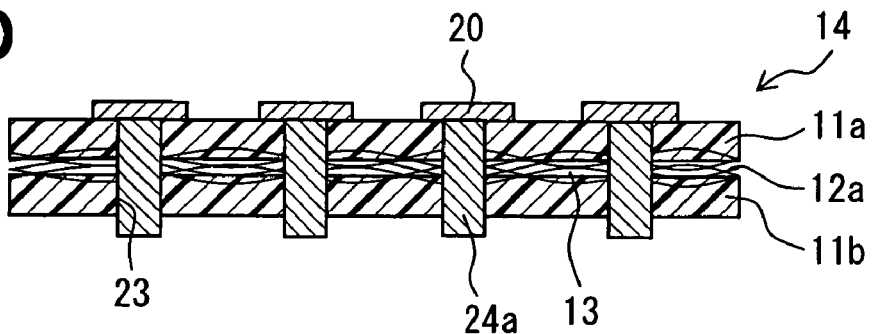

Then, in a process shown in FIG. 3D, the protection film 30 on the back side of the combined film 14 is removed.

In this way, the combined film 14 is processed to have the wiring pattern 20 and the conductive paste 24a so that the processed combined film 14 shown in FIG. 3D can be obtained.

Then, multiple processed combined films 14 are stacked and joined together by application of a second pressure and a second heat, so that the wiring board 100 shown in FIG. 1 can be completed.

Figure 4A:
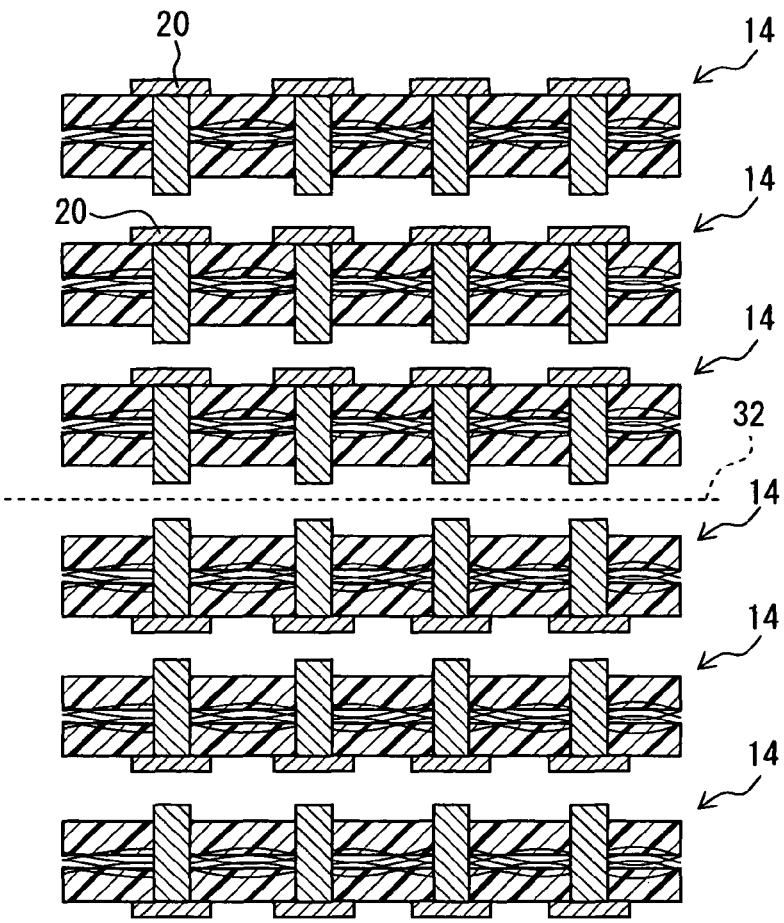
FIG. 4A is a diagram illustrating a cross-sectional view of the processed combined films stacked together before second pressure and second heat are applied.

In the embodiment, six processed combined films 14 are prepared. As shown in FIG. 4A, three of the six processed combined films 14 are stacked in such a manner that the back side of the processed combined film 14 face a middle plane 32 indicated by a broken line. Another three of the six processed combined films 14 are stacked in such a manner that the back side of the processed combined film 14 face the middle plane 32. The six processed combined films 14 are stacked to form a stacked film structure in such a manner that the three processed combined films 14 and the other three processed combined films 14 are symmetrically placed with respect to the middle plane 32. In such an approach, the wiring board 100 can have the wiring pattern 20 (i.e., outer wiring pattern 21) on its both side despite the fact that each processed combined film 14 has the wiring pattern 20 on one side.

Figure 4B:
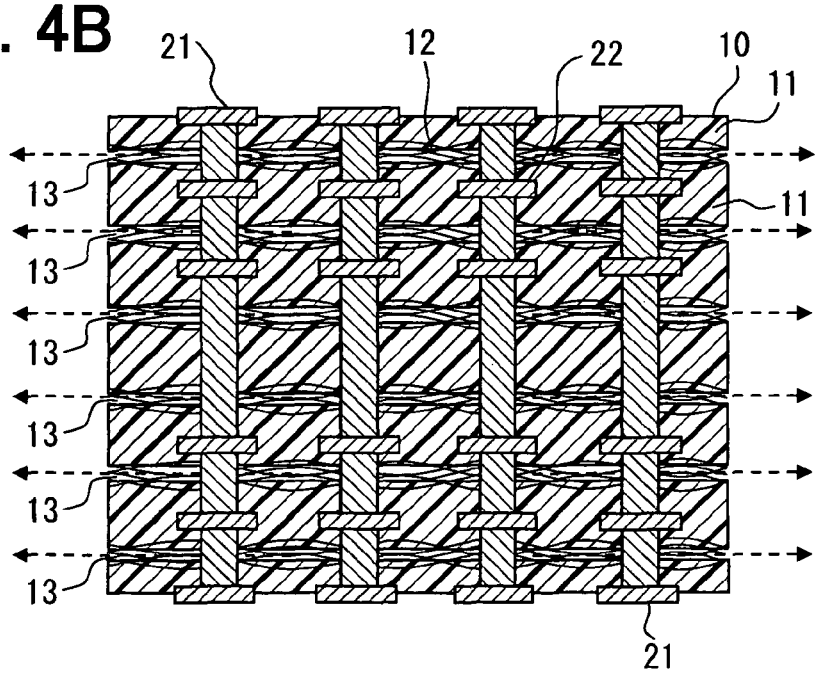
FIG. 4B is a diagram illustrating a cross-sectional view of the processed combined films joined together in a initial stage of the second pressure and heat application process.

In a process shown in FIG. 4B, the second pressure and the second heat are applied to the stacked film structure from its both sides in its stacked direction by using a vacuum hot-pressing machine. In the embodiment, the stacked film structure is heated to a temperature of about 250 to 350 degrees Celsius (° C.) under pressure of about 1 to 10 megapascals (Mpa). As a result, the resin films 11a, 11b of each combined film 14 are softened so that adjacent resin films 11a, 11b can be integrally joined together to form the substrate 10. Further, the conductive paste 24a is sintered by the application of the second heat and pressure and thus changes to the interlayer connecting member 24 that electrically couples the layered wiring patterns 20 together. In this way, the processed combined films 14 are integrally joined together so that the wiring board 100 shown in FIG. 1 can be completed.

Figure 5:
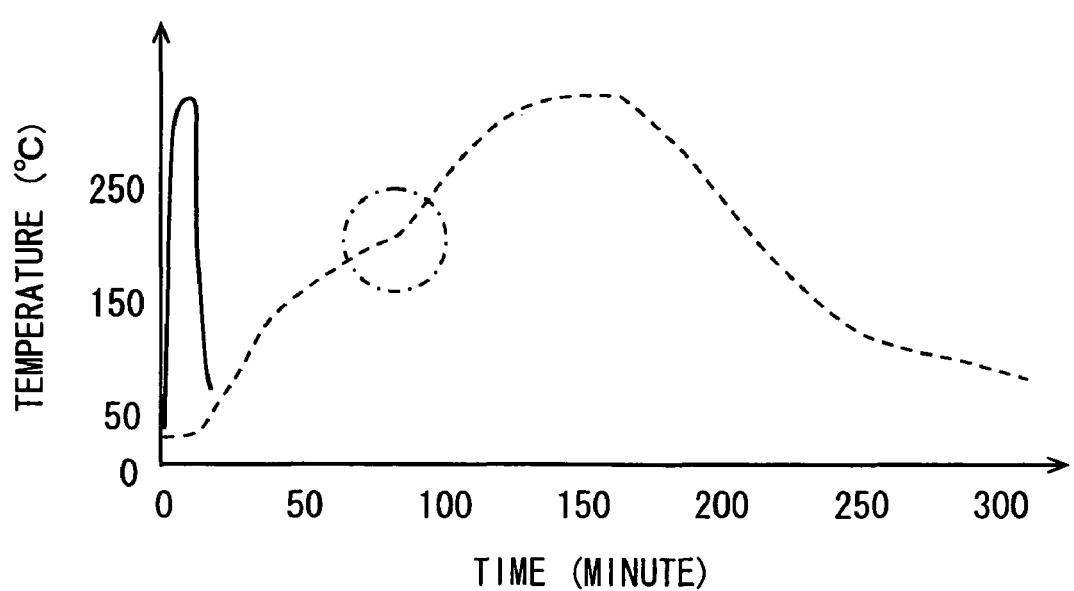
FIG. 5 is a graph illustrating a change in temperature with respect to time in the second pressure and heat application process.

By the way, in a wiring board, multiple resin films made of thermoplastic resin are stacked and joined together by application of pressure and heat. Moisture contained in thermoplastic resin of the resin film is vaporized to water vapor by the application of pressure and heat. The water vapor is less likely to escape outside the resin film by passing through the thermoplastic resin, as the thickness of the thermoplastic resin is larger. Since multiple resin films are stacked, it is much less likely that the water vapor escapes in the thickness direction of the resin film. As indicated by a broken line of FIG. 5, in a conventional wiring board (i.e., no fiber sheet 12a), the rate of change in temperature per unit time in the pressure and heat application process needs to be slow enough to allow the water vapor to escape outside the resin film before hydrolysis of thermoplastic resin occurs. There is a need to slow the temperature change rate down, in particular, in a region encircled by a broken line of FIG. 5. As a result, in the conventional wiring board, it takes several hours (e.g., 2 to 5 hours) to complete the pressure and heat application process.

In contrast, according to the embodiment, the wiring board 100 is made by using the combined film 14 that includes the fiber sheet 12a having the air space 13 inside. Since the air space 13 reduces the thickness of the thermoplastic resin, it is likely that the water vapor escapes outside the combined film 14 by passing through the thermoplastic resin. Here, it is noted that a temperature at which moisture is vaporized to the water vapor, a temperate at which hydrolysis of thermoplastic resin occurs, and a temperature at which thermoplastic resin is softened are different from one another. Therefore, even when the rate of change in temperature per unit time in the second pressure and heat application process is increased as indicated by a solid line of FIG. 5, the water vapor can escape outside the substrate 10 from both ends of the substrate 10 through the air space 13 in an initial stage of the second pressure and heat application process as indicated by broken arrows of FIG. 4B. Thus, the water vapor can escape outside the substrate 10, before the hydrolysis of thermoplastic resin occurs. Then, after the water vapor escapes outside the substrate 10, the temperature is increased to further soften the thermoplastic resin. As a result, adjacent combined films 14 are joined together, and the air space 13 is further filled with the softened thermoplastic resin. In the embodiment, the air space 13 is entirely filled with the thermoplastic resin by the application of the second pressure and heat so as to entirely eliminate the air space 13 from the substrate 10. Then, the wiring board 100 shown in FIG. 1 is completed by cooling the substrate 10.

As described above, according to the embodiment, manufacturing time of the wiring board 100 is reduced, while the hydrolysis of thermoplastic resin is prevented. Further, the air space 13 extends from one end of the combined film 14 to the other end of the combined film 14 in the planar direction of the combined film 14 and is open to outside of the combined film 14 at both ends. Therefore, the water vapor can efficiently escape outside the substrate 10 through the air space 13. Furthermore, the substrate 10 is made by using only the combined films 14, each of which has the fiber sheet 12a having the air space 13. In such an approach, the air space 13 is formed in the substrate 10 in a multilayer manner so that the water vapor can more efficiently escape outside the substrate 10 through the air space 13.

The present inventors have actually made the wiring board 100 by using the method according to the embodiment. Specifically, the present inventors have made the wiring board 100 by increasing the temperature change rate in the second pressure and heat application process to about 100° C./min as indicated by the solid line of FIG. 5, so that the manufacturing time of the wiring board 100 can be reduced to one-twentieth of the manufacturing time of the conventional wiring board. Then, the present inventors have carefully examined characteristics of the substrate 10 of the wiring board 100 such as heat resistance and mechanical strength. As a result, the present inventors have confirmed that the hydrolysis of thermoplastic resin is prevented so that the characteristics of the substrate 10 are not degraded.

Further, according to the embodiment, since the fiber sheet portion 12 (i.e., fiber sheet 12a) included in the substrate 10 serves as a reinforcement member, mechanical strength of the substrate 10 is improved. Accordingly, mechanical strength of the wiring board 100 is improved.

The embodiment described above can be modified in various ways. For example, the arrangement and the number of the layered wiring pattern 20 are not limited to the embodiment. The number of the stacked combined films 14 is not limited to the above embodiment.

In the embodiment, the substrate 10 is made by using only the combined film 14 including the fiber sheet 12a having the air space 13. Alternatively, the substrate 10 can be made by using at least one combined film 14 and a base film that is made of thermoplastic resin and has no fiber sheet 12a. As long as the substrate 10 includes at least one combined film 14, the manufacturing time of the wiring board 100 can be reduced, while the hydrolysis of thermoplastic resin is prevented. It is preferable that the substrate 10 is made by using two or more combined films 14 to allow the water vapor to efficiently escape outside the substrate 10.

In the embodiment, the combined film 14 having the air space 13 is formed by stacking and joining together the resin films 11a, 11b, the fiber sheet 12a, and the conductive foil 20a by the application of the first pressure and heat. The method of forming the combined film 14 is not limited to the embodiment. For example, the combined film 14 having the air space 13 can be formed by impregnating the fiber sheet 12a with thermoplastic resin.

In the embodiment, the conductive foil 20a is bonded on the front side of the combined film 14 by the application of the first pressure and heat. Alternatively, the conductive foil 20a can be bonded on the front side of the combined film 14 by an adhesive or the like, after the combined film 14 is formed. The conductive foil 20a (i.e., wiring pattern 20) can be formed on both sides of the combined film 14. The conductive foil 20a (i.e., wiring pattern 20) can be eliminated from the combined film 14.

In the embodiment, the combined film 14 includes a pair of first and second resin films 11a, 11b, each of which is made of the same type of thermoplastic resin. Alternatively, the first and second resin films 11a, 11b can be made of different types of thermoplastic resin. For example, the first resin film 11a can be made of a mixture of PEEK and PEI in a first mixture ratio, and the second resin film 11b can be made of a mixture of PEEK and PEI in a second mixture ratio different from the first mixture ratio. For another example, the first resin film 11a can be made of a first thermoplastic resin, and the second resin film 11b can be made of a second thermoplastic resin having a melting point lower than that of the first thermoplastic resin. In such an approach, the stacked combined films 14 can be joined together at a temperature lower than the melting point of the first thermoplastic resin (i.e., first resin film 11a). In this case, since the first resin film 11a, on which the wiring pattern 20 (conductive foil 20a) is bonded, is not softened, a displacement of the wiring pattern 20 in a planar direction of the combined film 14 can be prevented. In contrast to the first resin film 11a, the second resin film 11b is softened. Therefore, the stacked combined films 14 can be joined together by the softened second thermoplastic resin, and also the air space 13 in the combined film 14 can be filled with the softened second thermoplastic resin. For example, in a mixture of PEEK and PEI, a melting point of the mixture can be reduced by increasing a content ratio of PEI. When the content ratio of PEI exceeds 85%, the melting point of the mixture becomes too low to endure reflow process. Therefore, it is preferable that the content ratio of PEI is less than 85%.

In the embodiment, whereas the combined film 14 has the air space 13, the substrate 10 of the completed wiring board 100 has no air space 13. Alternatively, the substrate 10 of the completed wiring board 100 can have the air space 13. When the substrate 10 of the completed wiring board 100 has the air space 13, it is preferable that the air space 13 is located at a position other than edges of the substrate 10 in the planar direction of the substrate 10. That is, it is preferable that the air space 13 is located inside the substrate 10 so that the edges of the substrate 10 are sealed.

In the embodiment, the air space 13 of the combined film 14 extends from one end of the combined film 14 to the other end of the combined film 14 in the planar direction of the combined film 14 so that the air space 13 has a shape like a layer that wholly spaces the first and second resin films 11a, 11b of the combined film 14 from each other. The shape of the air space 13 is not limited to the embodiment. For example, the air space 13 can have a tunnel-like shape that extends from one end of the combined film 14 to the other end of the combined film 14 in the planar direction of the combined film 14 and is open to outside of the combined film 14 at both ends. For another example, multiple air spaces 13 are arranged adjacent to each other in the planar direction of the combined film 14 to form a single air space 13 extending from one end of the combined film 14 to the other end of the combined film 14.

In the embodiment, the substrate 10 is made by using multiple base films including at least one combined film 14. Alternatively, the substrate 10 can be made by using only one combined film 14.

For example, electronic devices such IC chips and capacitors are mounted on the outer wiring pattern 21 of the wiring board 100. The conductive foil 20a of the outermost combined film 14 can be patterned to the outer wiring pattern 21, after the combined films 14 are joined together by the application of the second pressure and heat. In such an approach, even when the first resin film 11a of the outermost combined film 14 is softened by the application of the second pressure and heat, and the conductive foil 20a on the softened resin film 11a is displaced, the outer wiring pattern 20 can be formed in an expected pattern by patterning the conductive foil 20a. Therefore, connection reliability between the electronic device and the outer wiring pattern 21 can be ensured.

Such changes and modifications are to be understood as being within the scope of the present invention as defined by the appended claims.

What is claimed is:

1. A method of making a wiring board having an electrically insulating substrate and a wiring pattern formed in the substrate in a multilayer manner, the method comprising:
    stacking a plurality of base films in a predetermined direction to form a stacked film structure, each base film including at least one thermoplastic resin film; and
    applying a first pressure and a first heat to the stacked film structure from both sides in a stacked direction so that the plurality of base films is joined together to form the electrically insulating substrate, wherein
    at least one of the plurality of base films is a combined film including two thermoplastic resin films and a fiber sheet sandwiched between the thermoplastic resin films in such a manner that air space remains in the fiber sheet, and
    the applying of the first pressure and the first heat comprises heating the combined film to a predetermined temperature, which is equal to or greater than a temperature at which the thermoplastic resin films are hydrolyzed, to soften the thermoplastic resin films of the combined film and to eliminate the air space from the fiber sheet of the combined film by filling the air space with the softened thermoplastic resin films.

2. The method according to claim 1, wherein each of the plurality of base films is the combined film.

3. The method according to claim 1, further comprising:
    forming the combined film by placing the fiber sheet between the two thermoplastic resin films, the forming the combined film including applying a second pressure and a second heat to the two thermoplastic films so that the fiber sheet and the two thermoplastic films are joined together.

4. The method according to claim 1, further comprising:
    forming the combined film by impregnating the fiber sheet with thermoplastic resin.

5. The method according to claim 1, wherein the fiber sheet of the combined film is a woven cloth or a nonwoven cloth.

6. The method according to claim 1, wherein the fiber sheet of the combined film is made of glass fiber.

7. The method according to claim 1, wherein the applying the first pressure and the first heat includes entirely filling the air space with the softened thermoplastic resin films.

8. The method according to claim 1, wherein the applying the second pressure and the second heat includes partially filling the air space with the softened thermoplastic resin films to prevent the air space from being exposed outside of the substrate.

* * * * *